United States Patent
Han et al.

(10) Patent No.: US 10,248,017 B2
(45) Date of Patent: *Apr. 2, 2019

(54) STRUCTURE DESIGN GENERATION FOR FIXING METAL TIP-TO-TIP ACROSS CELL BOUNDARY

(71) Applicant: International Business Machines Corporation, Armonk, NY (US)

(72) Inventors: Geng Han, Fishkill, NY (US); Dongbing Shao, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/811,006

(22) Filed: Nov. 13, 2017

(65) Prior Publication Data

US 2018/0067391 A1 Mar. 8, 2018

Related U.S. Application Data

(63) Continuation of application No. 14/967,103, filed on Dec. 11, 2015, now Pat. No. 9,885,951.

(51) Int. Cl.
*G06F 17/50* (2006.01)
*G03F 1/70* (2012.01)

(52) U.S. Cl.
CPC ............ *G03F 1/70* (2013.01); *G06F 17/5072* (2013.01); *G06F 17/5081* (2013.01)

(58) Field of Classification Search
CPC ................ G03F 1/70; G06F 15/5072

USPC .................................................. 716/52
See application file for complete search history.

(56) References Cited

U.S. PATENT DOCUMENTS

| | | |
|---|---|---|
| 6,536,023 B1 | 3/2003 | Mohan et al. |
| 7,096,447 B1 | 8/2006 | Li et al. |
| 7,134,111 B2 | 11/2006 | Nakamoto |
| 7,512,927 B2 | 3/2009 | Gallatin et al. |
| 7,721,243 B2 | 5/2010 | Hetzel |
| 8,110,855 B2 | 2/2012 | Houston et al. |
| 8,230,372 B2 | 7/2012 | Agarwal |
| 8,307,321 B2 | 11/2012 | Liu et al. |
| 8,347,240 B2 | 1/2013 | Agarwal et al. |
| 8,368,225 B2 | 2/2013 | Ikegmi et al. |
| 8,612,902 B1 | 12/2013 | Agarwal et al. |

(Continued)

OTHER PUBLICATIONS

List of IBM Patents or Patent Applications Treated as Related Form.
(Continued)

*Primary Examiner* — Jack Chiang
(74) *Attorney, Agent, or Firm* — Sherman IP LLP; Kenneth L. Sherman; Steven Laut

(57) ABSTRACT

A method for structure design including a processor performing error processing of an initial design file layout. The processor detects a structure design violation at a design cell boundary for a metal layer above (Ma) a via (Vx) at a tip of the Ma for the initial design file layout for a semiconductor structure based on a library of pattern rules. Upon detection of the structure design violation, the processor retargets the Vx for generating a resulting design file layout of the semiconductor structure. A physical semiconductor structure is generated based on the resulting design file layout of the semiconductor structure.

20 Claims, 8 Drawing Sheets

(56) References Cited

U.S. PATENT DOCUMENTS

| | | |
|---|---|---|
| 8,627,242 B1 | 1/2014 | Kuo |
| 8,713,499 B2 | 4/2014 | Manakli |
| 8,793,627 B1 | 7/2014 | Stephens et al. |
| 9,087,174 B1 | 7/2015 | Zhang |
| 8,954,913 B1 | 12/2015 | Yuan et al. |
| 9,437,481 B2 | 9/2016 | Yuan et al. |
| 9,651,855 B2 | 5/2017 | Sun et al. |
| 2007/0083842 A1* | 4/2007 | Namba ............... G06F 17/5072 257/208 |
| 2009/0144686 A1 | 6/2009 | Lensing et al. |
| 2010/0038783 A1 | 2/2010 | Yang et al. |
| 2011/0020986 A1 | 1/2011 | Houston et al. |
| 2011/0191728 A1 | 8/2011 | Yang et al. |
| 2015/0302134 A1 | 10/2015 | Berkens |

OTHER PUBLICATIONS

List of IBM Patents or Patent Applications Treated as Related Form; Han, G., U.S. Appl. No. 16/239,165, Filed Jan. 3, 2019; Han, G., U.S. Appl. No. 16/261,264, Filed Jan. 29, 2019.

\* cited by examiner

STRUCTURE DESIGN GENERATION FOR FIXING METAL TIP-TO-TIP ACROSS CELL BOUNDARY

BACKGROUND

Designing of integrated circuit (IC) structures on a wafer often relies on photolithography. Photolithographic processes can be used to transfer a pattern of a photomask to a wafer. Feature size, line width, and the separation between features and lines are becoming increasingly smaller.

IC devices are formed in layers with interconnect structures, such as trenches and vias that are used to form interlayer connections between features, such as lines. For example, a via may be used to connect a line feature, such as a gate electrode, in a first layer to a metal line feature in another layer formed above the first layer. The accuracy at which the interconnect structures align with underlying features affects the functionality of the device.

SUMMARY

Embodiments relate to structure design flow that includes retargeting any of a metal layer above, a metal layer below a via, and the via connecting the metal above and the metal below. In one embodiment, a method includes a processor performing error processing of an initial design file layout. The processor detects a structure design violation at a design cell boundary for a metal layer above (Ma) a via (Vx) at a tip of the Ma for the initial design file layout for a semiconductor structure based on a library of pattern rules. Upon detection of the structure design violation, the processor retargets the Vx for generating a resulting design file layout of the semiconductor structure. A physical semiconductor structure is generated based on the resulting design file layout of the semiconductor structure.

These and other features, aspects and advantages of the embodiments will become understood with reference to the following description, appended claims and accompanying figures.

DETAILED DESCRIPTION

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Embodiments relate to integrated circuit (IC) structure design flow, in particular, for structure design flow that includes retargeting both a metal layer above and/or a metal layer below a via, and/or the via connecting them for a self-aligned via process to avoid insertion of dummy cell at cell boundary at the penalty of area waste.

Figure 1:
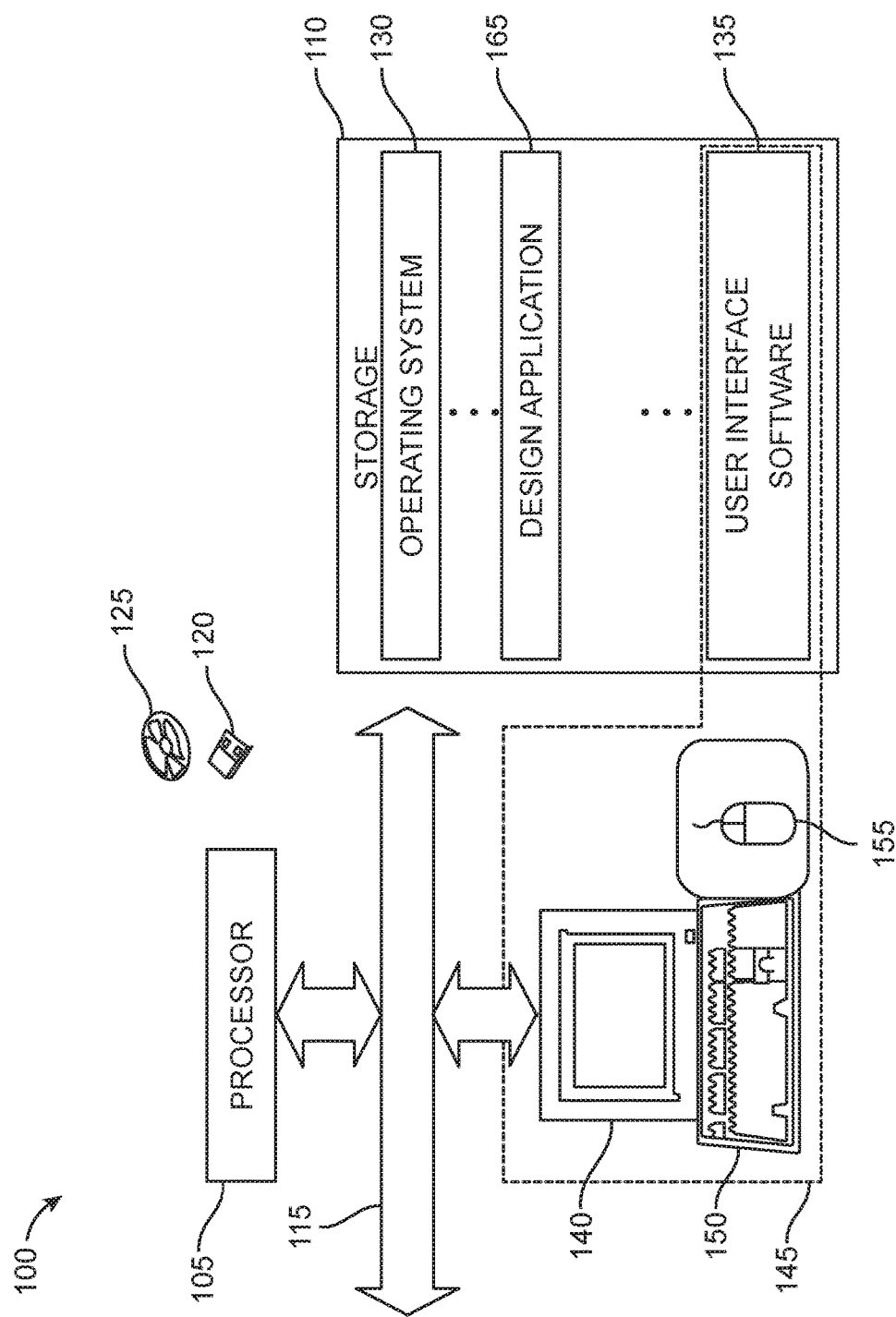
FIG. 1 shows a computing environment for generating semiconductor designs, according to an embodiment.

FIG. 1 shows a computing environment for generating semiconductor designs, according to an embodiment. In one embodiment, the design system 100 includes a processor 105 communicating with storage 110 over a bus system 115 or through a wireless network. The storage 110 may include a hard disk and/or random access memory (RAM) and/or removable storage, such as a magnetic disk 120, an optical disk 125, or any other removable device (e.g., a universal serial bus (USB device), a flash device, etc.). The storage 110 includes an operating system (OS) 130, user interface software 135, and a design application 165 (e.g., a design for manufacturing (DFM) application, etc.). The user interface software 135, in conjunction with a display 140, implements a user interface 145. The user interface 145 may include peripheral I/O devices such as a keypad or keyboard 150, pointing device/mouse 155, etc. The processor 105 runs under the control of the OS 130, which may be a conventional OS or proprietary OS. The design application 165 is invoked by the OS 130 upon power up, reset, user interaction, etc., depending on the implementation of the OS 130. A user may invoke the design application 165 in conventional fashion through the user interface 145. Note that although a stand-alone design system 100 is illustrated, there is no need for the data to reside on the same design system 100 as the design application 165 by which it is processed. In one example, the design application 165 may include multiple components that may reside on different design systems 100. Some embodiments may be implemented on a distributed computing system with distributed storage and/or processing capabilities.

In one embodiment, the design application 165 may be executed by the design system 100 to design semiconductor devices and retarget shapes in the layout to improve semiconductor structure design. Data for the semiconductor structure design may be stored on a computer readable storage device (e.g., storage 110, disks 120, 125, solid state storage, etc.).

Figure 7:
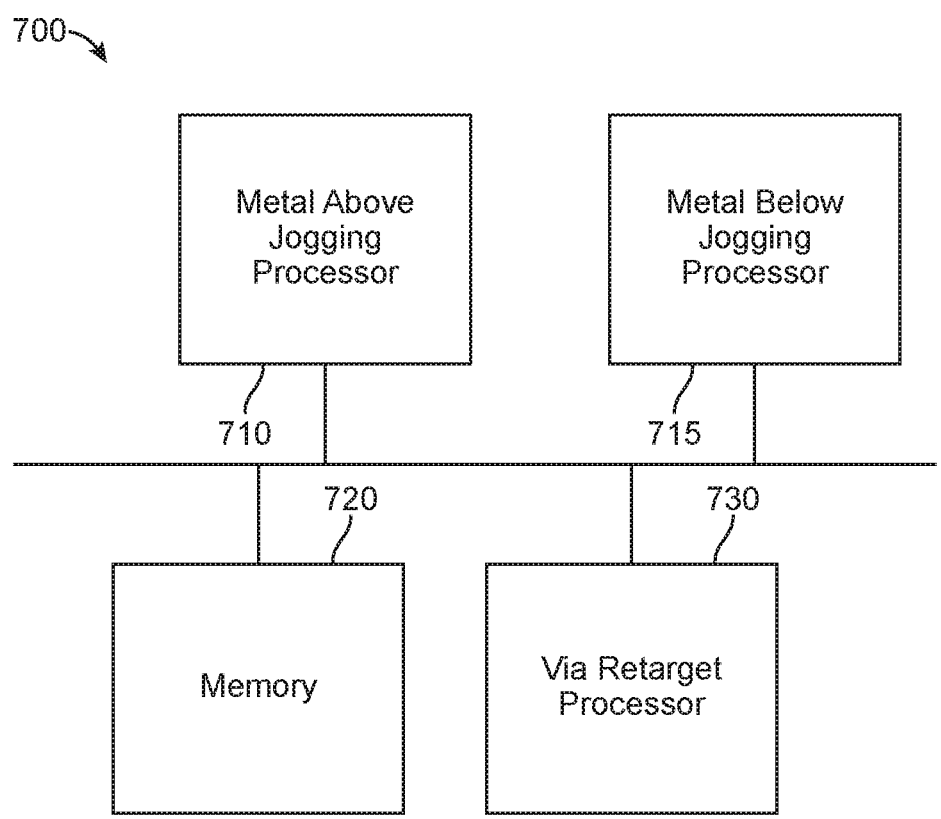
FIG. 7 shows a block diagram for a processing system for semiconductor design with metal layer above, metal layer below and via retargeting, according to an embodiment.
Figures 8A, 8B:
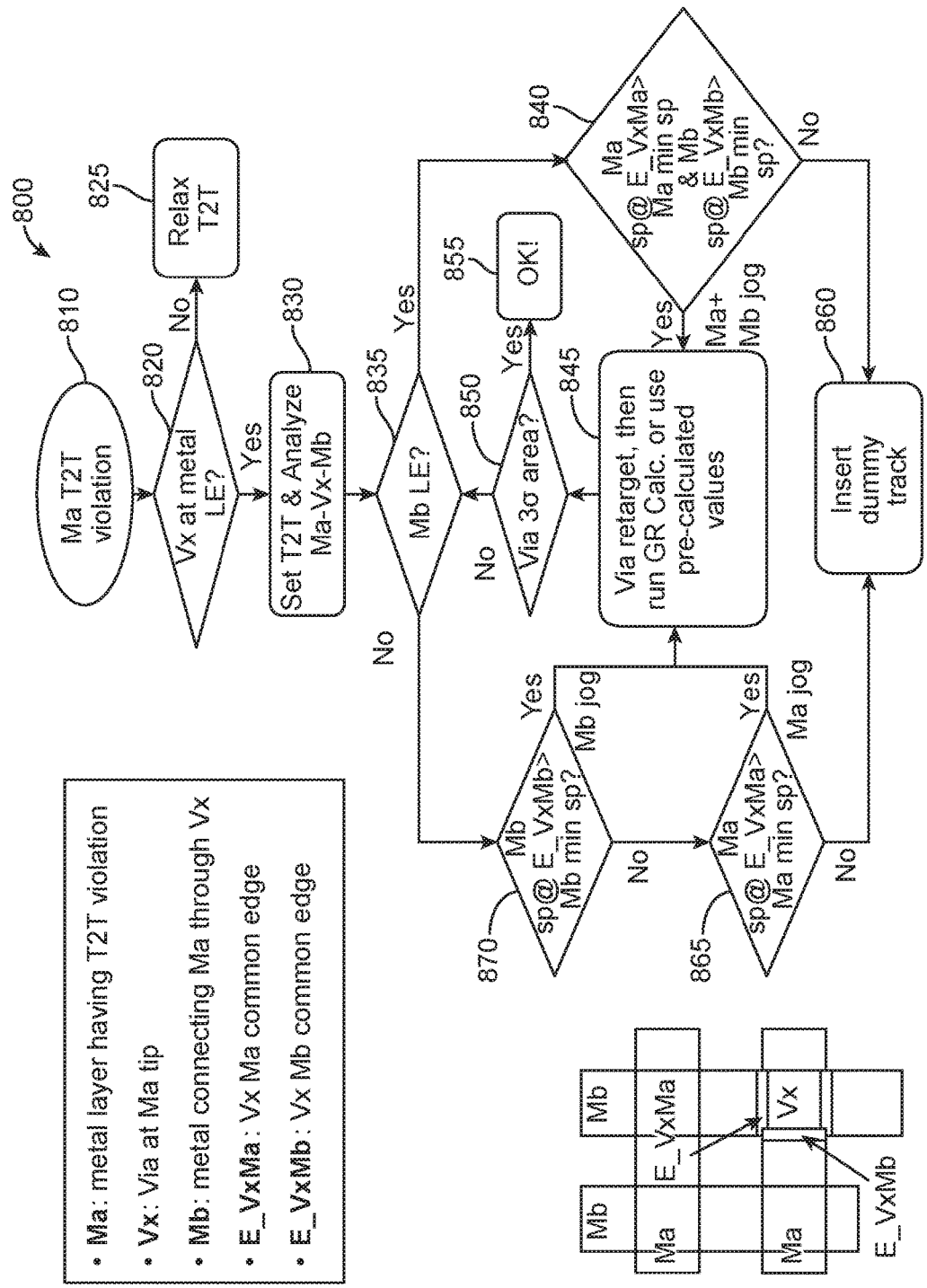
FIG. 8A shows a block diagram for semiconductor structure design processing for via, metal above, metal below retargeting, according to an embodiment.
FIG. 8B shows an example design graphic to assist in understanding of the semiconductor structure design processing of FIG. 8A.
Figure 9:
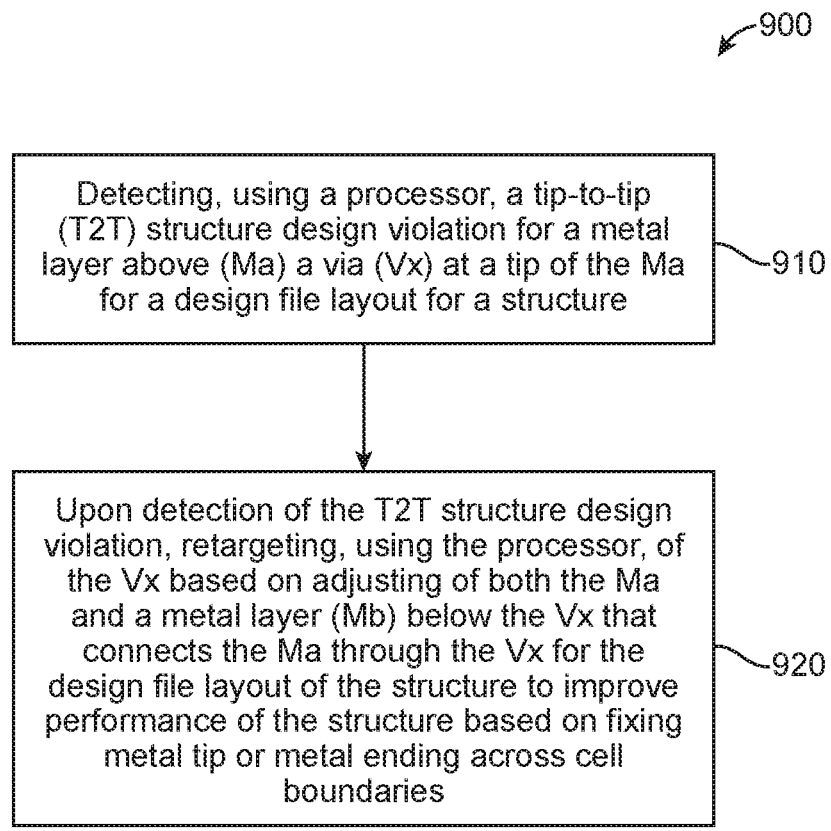
FIG. 9 shows a block diagram for a process for semiconductor structure design, according to one embodiment.

In one embodiment, a process flow for the design system 100 in implementing the design activities of the design application 165 is illustrated in FIG. 8A and the process of FIG. 9. The design system 100 implementing the design application 165 may be processed using system 700. Inputs to the processing system 700 (FIG. 7) may include a design layout file and a library of pattern rules stored in the memory 720, which may include design rules for pattern checking and tables for retargeting. In one example, a design layout file is checked for design rule errors prior to the design processing of process 700.

Figure 2:
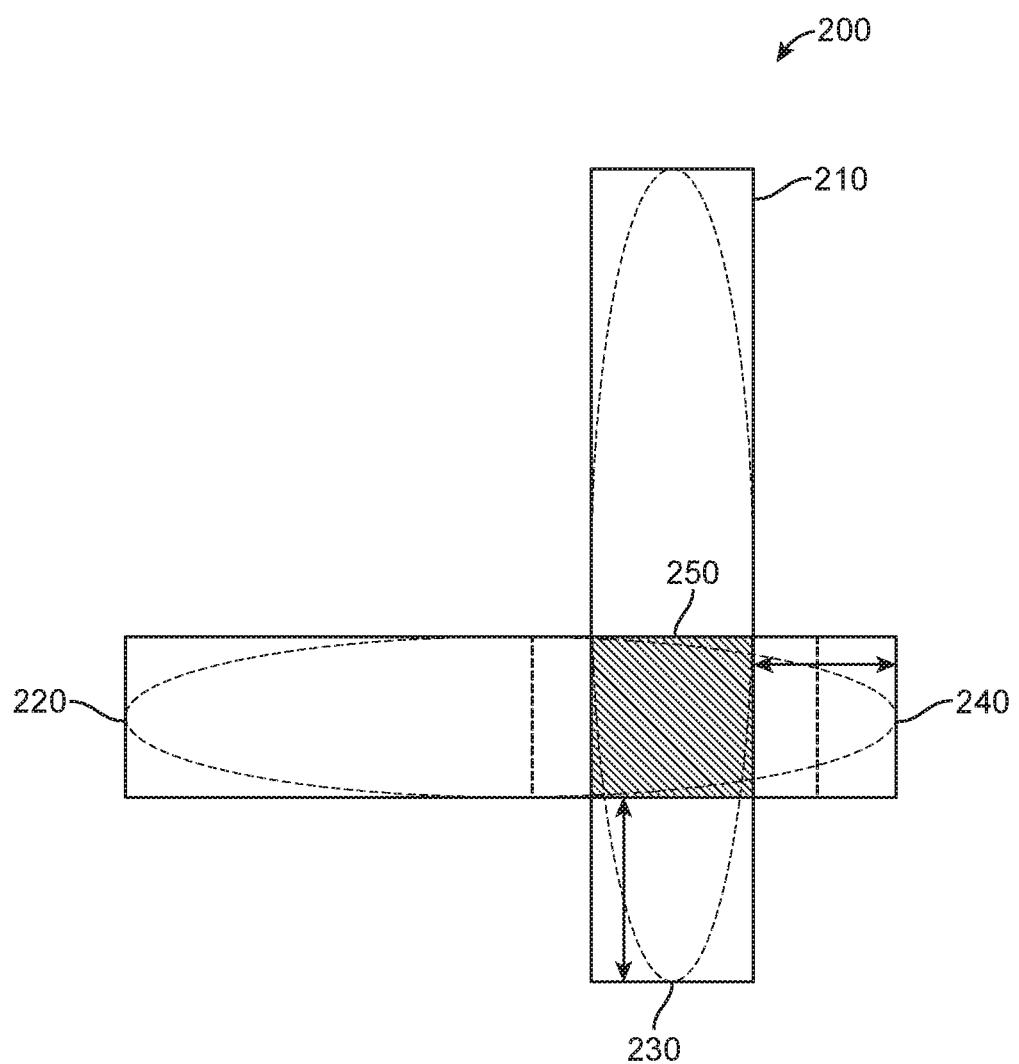
FIG. 2 shows an example via design graphic for metal layers above and below.

FIG. 2 shows an example via design graphic 200 for a metal layer above 210 a via 250 and a metal layer below 220 the via 250. Also depicted are the enclosure to the metal below 240 and the enclosure to the metal above 230. Line end (LE) critical dimension (CD) uniformity (CDU) does not scale with CD. That is, the opposite occurs, such as extreme ultra-violet (EUV) LE CDU. The consequences may lead to larger metal-via enclosure value to ensure via-metal contact area, and may include: requirement from reliability; LE two-dimension (2D) effects making design more complicated; large enclosure for metal above and below are required to ensure manufacturability as well as performance.

Figure 3:
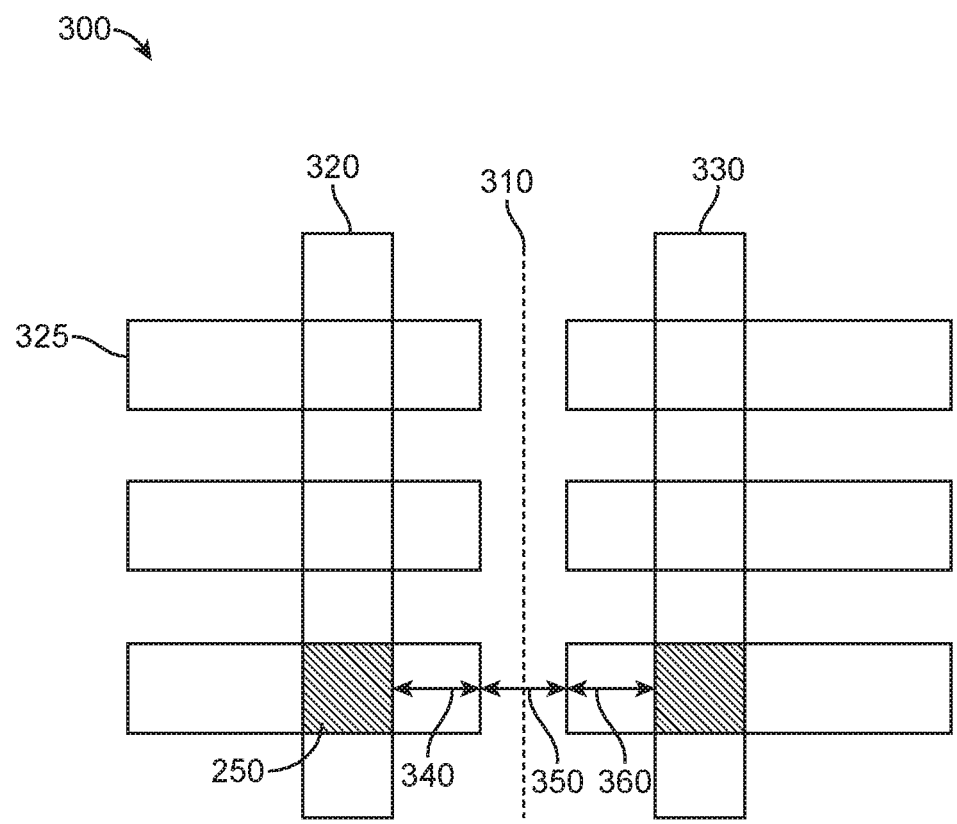
FIG. 3 shows an example graphic showing a cell boundary for via design.

FIG. 3 shows an example graphic 300 showing a cell boundary 310 for via 250 design. The graphic 300 shows the cell boundary 310, metal layer below 325, metal layer above 320 (and 330 for the cell on the right side of the graphic 300), via 250, enclosure to metal below 340 (and 360 for the cell on the right side of the graphic 300) and tip-to-tip (T2T) space 350 between the two cells.

In the design of semiconductor vias, metal LE CDU has an impact to both metal T2T and metal-via enclosure value. A large metal-via enclosure value has scaling impact, especially at a cell boundary. One consequence results with a larger metal-via enclosure value to ensure via-metal contact area. A large LE CDU also means a larger T2T space 350 is needed. This leads to an impact in density scaling and results in limited choices for a designer, especially at the cell boundary 310 as a designer has to use dummy cell placement that wastes area and could lead to unpredictable performance of an integrated circuit (IC).

Some of the challenges of LE CDU control for semiconductor design are that CDU does not scale; LE CDU have been observed to increase. The smaller the width, the larger the LE CDU (even with EUV) due to poor image quality at LE. This leads to a larger T2T space 350 and/or larger tip-to-side (T2S) space. There are competing concerns, such as metal T2T versus via contact area. T2T space 350 is an immediate short fail, and via contact area reliability; there may be room to compromise but it may lead to other issues.

Figure 4:
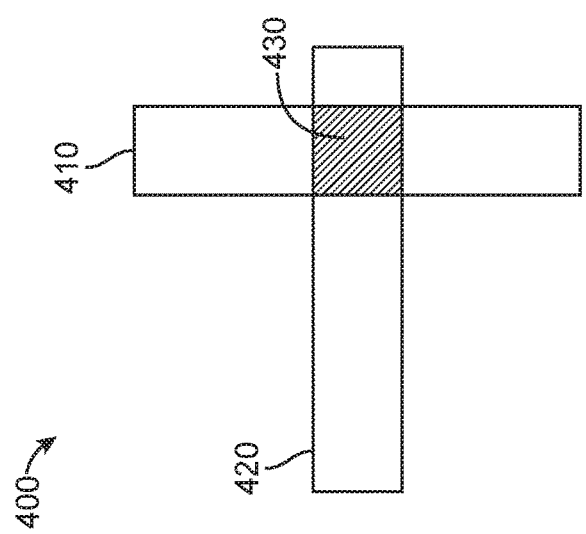
FIG. 4 shows an example product on record (POR) for an A×B enclosure to line end of metal below.

FIG. 4 shows an example graphic of a product on record (POR) 400 for an A×B sized enclosure to metal below. In one example, A×B may be 0×0.0XX, where X is a positive integer. This example shows a case for landing on LE of metal below that is a candidate for retargeting. In the POR 400, a via is referenced as 430, the metal below is referenced as 420 and the metal above is referenced as 410.

Figure 5:
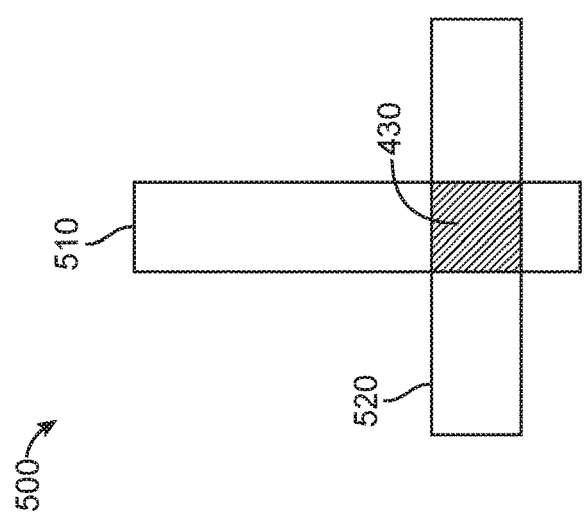
FIG. 5 shows an example POR for an A×C enclosure to line end of metal above.

FIG. 5 shows an example POR 500 for an A×C enclosure to metal above. This example shows a case for landing on LE of metal above that is a candidate for retargeting. In one example, C is an integer and greater than B in FIG. 4. In the POR 500, the metal below is referenced as 520 and the reference of the metal above is referenced as 510.

Figure 6:
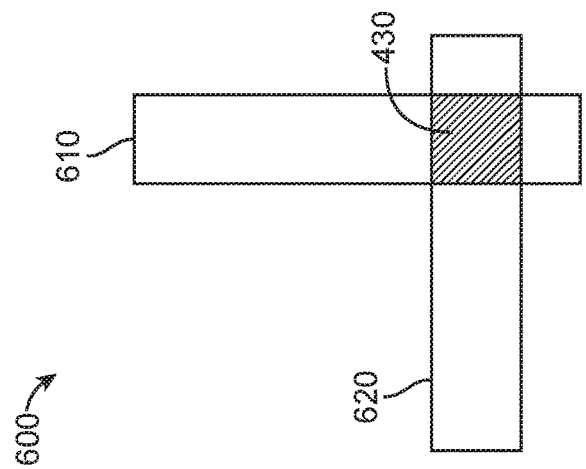
FIG. 6 shows an example POR for a via enclosure to metal line end of both metal above and metal below.

FIG. 6 shows an example POR 600 for an A×C enclosure for metal below 620 having a size A×B. This example shows a case for landing on LE of both metal above and metal below that is a candidate for retargeting. In the POR 600, the metal above is referenced as 610.

FIG. 7 shows a block diagram for a processing system 700 for semiconductor design with metal layer above, metal layer below and via retargeting, according to an embodiment. In one embodiment, the processing system includes a metal above jogging processor 710, a metal below jogging processor 715, one or more memory devices 720 and via retarget processor 730. The one or more memory devices 720 may include one or more non-removable and/or removable memory devices (e.g., storage disk devices, storage systems, distributed file systems, cloud-based storage systems, removable memory device(s), etc.). Enlarging the via alone does not help the 3σ area due to self-aligned via (SAV). Therefore, in some embodiments metal above jogging for SAV retargeting may be performed by the metal above jogging processor 710. In another embodiment, both via jogging and metal below jogging may be performed by the via retarget processor 730 with the metal below jogging processor 715. In yet another embodiment, if both metal above and below is LE, then processing system performs jogging of the metal above, the metal below and the via using the metal above jogging processor 710, the metal below jogging processor 715 and the via retarget processor 730.

In conventional design, metal jogging may not be preferred by a design team due to complex shape to support by patterning, short concerns, and complex rules. However, in one embodiment, metal jogging is acceptable to support a limited use case, especially with achieved benefits. In some embodiments, the processing system provides metal jogging as an opportunistic approach where: metal jogging is used for non-standard ground rule (GR)-clean shapes and shape after the flow is low risk.

FIG. 8A shows a block diagram 800 for semiconductor structure design processing for via, metal above, metal below retargeting, according to an embodiment. FIG. 8B shows an example design graphic to assist in understanding of the semiconductor structure design processing of FIG. 8A. In one embodiment, in block 810 a processor (e.g., processor 105, FIG. 1, processor 1005, FIG. 10) detects a T2T structure design rule violation for a metal layer above (Ma) a via (Vx) at a tip of the Ma for a design file layout for the semiconductor structure being designed. Once the T2T structure design rule violation is detected, in block 820 the processor determines if the Vx is at the metal LE. In one example, if the Vx is not at the metal LE, the processing continues to block 825 where the T2T rule (e.g., requirement values) is relaxed (e.g., so that the T2T rule would not be violated for the semiconductor structure design). In one example, the relaxing of the T2T rule may be made after cell placement and may include a small layout fix at the T2T space, where the design rule check (DRC) does not have to be performed again.

In one embodiment, in block 820 if the processor determines that the Vx is at a metal LE, the processing proceeds to block 830 where the processor sets the T2T design value for the design file layout for the semiconductor structure and analyzes the Ma, the Vx and the metal layer (Mb) below the Vx that connects the Ma through the Vx to determine whether the Mb is at a metal LE. The processing continues to block 835 where the processor determines whether the Mb is at a metal LE. If the processor determines that the Mb is at the metal LE, the processing proceeds to block 840. In block 840, the processor determines whether the Ma available space at a common edge (E_VxMa) between the Ma and the Vx is greater than the minimum allowable space for the Ma and that the Mb available space at a common edge (E_VxMb) between the Mb and the Vx is greater than the Mb minimum space. If the processor determines that the outcome of the determination in block 840 is not true, then the processing proceeds to block 860 and the processor inserts a dummy track into the design file layout for the structure. If the processor determines that the outcome of the determination in block 840 is true, the processing proceeds to block 845.

In block 845, the processor performs via retargeting including jogging the design value for the Ma and for the Mb and retargeting the design value for the Vx and proceeds to run a ground rule calculation design processing or uses pre-computed values determined by a designer and stored in memory (e.g., a memory device 720). In one embodiment, processing 800 proceeds to block 850 where the processor determines whether the via design falls within the 3σ area. If the processor determines that the via design falls within the 3σ area, processing 800 proceeds to block 855 where the structure design is found to be within desired values and the structure design layout is stored in the memory. If the processor determines that the via design does not fall within the 3σ area, the processing returns to block 835.

In block 835, if the processor determines that the Mb is not at a metal LE, the processing proceeds to block 870. In one embodiment, in block 870 it is determined whether the Mb available space at E_VxMb is greater than a minimum allowable space for the Mb. If the determination in block 870 is true, the processor performs jogging a design value for the Mb and proceeds to block 845. Upon the processor determining that the Mb available space at E_VxMb is not greater than a minimum allowable space for the Mb, the processing proceeds to block 865.

In one embodiment, in block 865 the processor determines if the Ma available space at E_VxMa is greater than a minimum allowable space for the Ma. If the processor determines that the Ma available space at E_VxMa is greater than a minimum allowable space for the Ma, the processor performs jogging a design value for the Ma and the processing proceeds to block 845. If the processor determines that the Ma available space at E_VxMa is not greater than a minimum allowable space for the Ma, the processing continues to block 860. The result of processing that leads to block 855 for the design file layout of the structure improves performance of the structure based on fixing metal tip or metal ending across cell boundaries. In one embodiment, the retargeting of the Vx comprises retargeting metal below the Vx in a vertical direction to avoid Vx metal shorting.

FIG. 9 shows a block diagram for a process 900 for semiconductor structure design, according to one embodiment. In one embodiment, in block 910 process 900 includes detecting, by a processor (e.g., processor 105, FIG. 1, processor 1005, FIG. 10), a T2T structure design violation at a design cell boundary for a Ma above a Vx at a tip of the Ma for a design file layout for the structure. In block 920 upon detection of the T2T structure design violation, process 900 retargets, by the processor, the Vx based on adjusting any of the Ma, a Mb below the Vx that connects the Ma through the Vx and the Vx that connects the Ma and the Mb for the design file layout of the structure to improve performance of the structure based on fixing metal tip or metal ending across cell boundaries.

In one embodiment, process 900 may further include determining whether the Vx is at a first metal LE. Upon the Vx being at the metal LE, the process 900 may set the T2T design value for the design file layout for the structure and analyze the Ma, the Vx and the Mb to determine whether the Mb is at a second metal LE. In another embodiment, process 900 may include that upon the Vx not being at the first metal LE, relaxing T2T requirement values for the design file layout for the structure.

In one embodiment, process 900 may further include upon a determination that the Mb is not at the second metal LE, determining the Mb available space at E_VxMb between the Mb and the Vx. In another embodiment, upon a determination that the Mb available space at E_VxMb is greater than a minimum allowable space for the Mb, process 900 may perform jogging a design value for the Mb, retargeting a design value for the Vx and executing a design process or using a first set of predetermined design values. Upon a determination that the Mb available space at E_VxMb is not greater than a minimum allowable space for the Mb, then upon a determination that the Ma available space at E_VxMa between the Ma and the Vx is greater than a minimum allowable space for the Ma, process 900 may perform jogging a design value for the Ma, retargeting the design value for the Vx and executing the design process or using a second set of predetermined design values.

In one embodiment, process 900 may further include that upon a determination that the Mb is at the second metal LE, upon a determination that the Ma available space at E_VxMa is greater than the minimum allowable space for the Ma and the Mb available space at E_VxMb is greater than the Mb minimum space, the processor performs jogging the design value for the Ma and for the Mb, retargets the design value for the Vx and executes the design process or using a third set of predetermined design values. Process 900 may include that upon a determination that the Mb is at the second metal LE, process 900 may continue by inserting a dummy track into the design file layout for the structure.

In one embodiment, process 900 may include that the retargeting of the Vx includes only retargeting metal below the Vx in a vertical direction to avoid Vx metal shorting. Process 900 may include that upon a determination that a resulting design file layout for the structure falls outside of a three sigma area for the Vx, re-determining whether the Mb is at the second metal LE, otherwise outputting a final design file layout for the structure.

Figure 10:
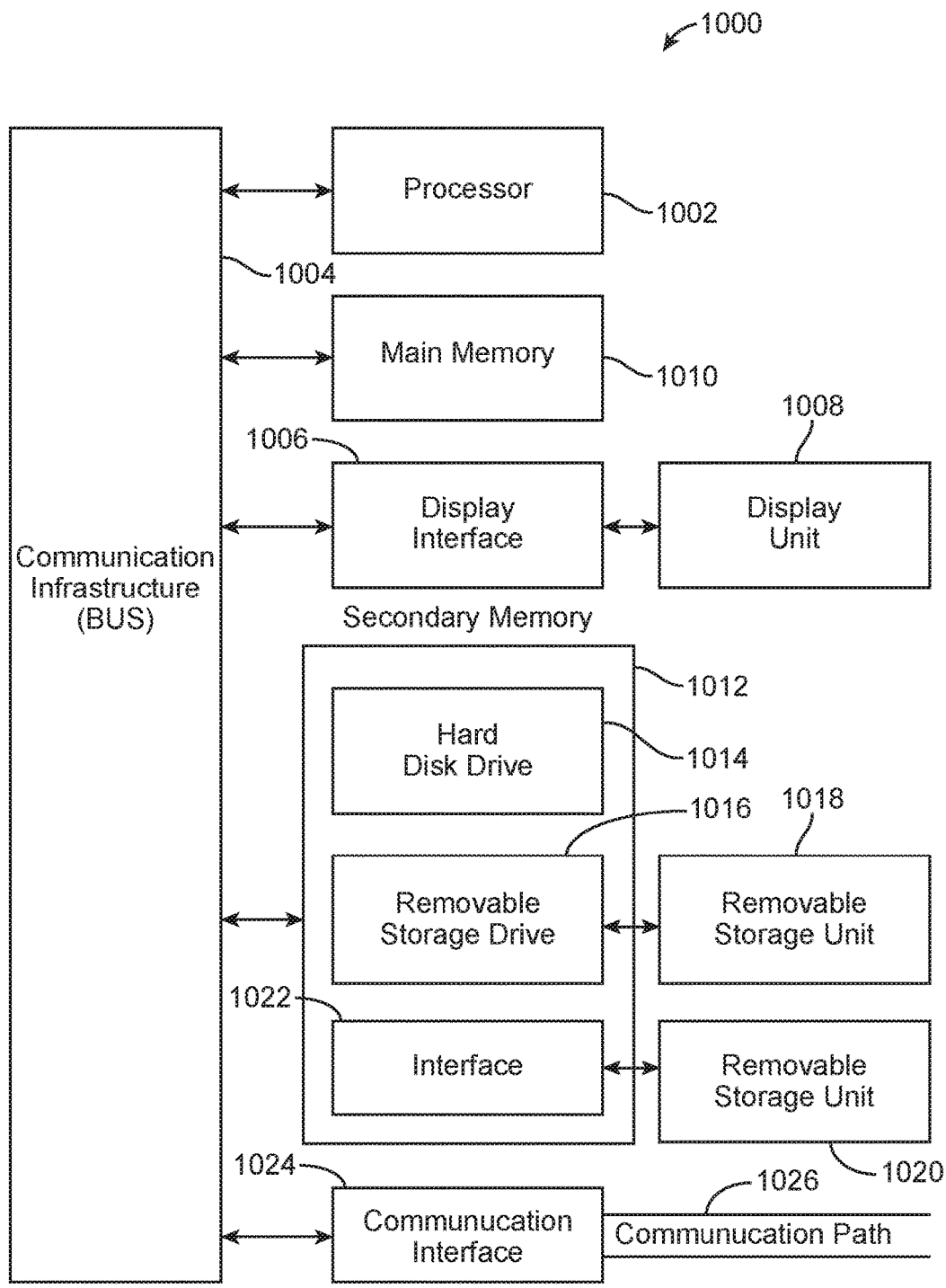
FIG. 10 shows a high level block diagram showing an information processing system, according to one embodiment.

FIG. 10 is a high level block diagram showing an information processing system 1000 useful for implementing one or more embodiments (e.g., processing system 700, processing 800, process 900, etc.). The computer system includes one or more processors, such as processor 1002. In one embodiment, the processor 1002 may function similarly as processor 105 (FIG. 1). The processor 1002 is connected to a communication infrastructure 1004 (e.g., a communications bus, cross-over bar, or network). In one embodiment, the processor 1002 provides detection of a structure design violation at a design cell boundary for a metal layer above (Ma) a via (Vx) at a tip of the Ma for generating a design file layout for the structure. The processor 1002 may further provide, upon detection of the structure design violation, retargeting of design values for the Vx based on adjusting design values for any of the Ma, a metal layer (Mb) below the Vx that connects the Ma through the Vx and the Vx that connects the Ma and the Mb for the design file layout of the structure. The processor 1002 adjusts design values of both the Ma and the Mb to provide fixing metal tip or metal ending across cell boundaries.

The computer system can include a display interface 1006 that forwards graphics, text, and other data from the communication infrastructure 1004 (or from a frame buffer not shown) for display on a display unit 1008. The computer system also includes a main memory 1010, preferably random access memory (RAM), and may also include a secondary memory 1012. The secondary memory 1012 may include, for example, a hard disk drive 1014 and/or a removable storage drive 1016, representing, for example, a floppy disk drive, a magnetic tape drive, or an optical disk drive. The removable storage drive 1016 reads from and/or writes to a removable storage unit 1018 in a manner well known to those having ordinary skill in the art. Removable storage unit 1018 represents, for example, a floppy disk, a compact disc, a magnetic tape, or an optical disk, etc. which is read by and written to by removable storage drive 1016. As will be appreciated, the removable storage unit 1018 includes a computer readable medium having stored therein computer software and/or data.

In alternative embodiments, the secondary memory 1012 may include other similar means for allowing computer programs or other instructions to be loaded into the computer system. Such means may include, for example, a removable storage unit 1020 and an interface 1022. Examples of such means may include a program package and package interface (such as that found in video game devices), a removable memory chip (such as an EPROM, or PROM) and associated socket, and other removable storage units 1020 and interfaces 1022, which allows software and data to be transferred from the removable storage unit 1020 to the computer system.

The computer system may also include a communication interface 1024. Communication interface 1024 allows software and data to be transferred between the computer system and external devices. Examples of communication interface 1024 may include a modem, a network interface (such as an Ethernet card), a communication port, or a PCMCIA slot and card, etc. Software and data transferred via communication interface 1024 are in the form of signals which may be, for example, electronic, electromagnetic, optical, or other signals capable of being received by communication interface 1024. These signals are provided to communication interface 1024 via a communication path (i.e., channel) 1026. This communication path 1026 carries signals and may be implemented using wire or cable, fiber optics, a phone line, a cellular phone link, an RF link, and/or other communication channels.

As will be appreciated by one skilled in the art, aspects of the embodiments may be embodied as a system, method or computer program product. Accordingly, aspects of one or more embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of one or more embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the embodiments are described below with reference to flowchart illustrations and/or block diagrams of methods, apparatus (systems) and computer program products according to one or more embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the claims to an element in the singular is not intended to mean "one and only" unless explicitly so stated, but rather "one or more." All structural and functional equivalents to the elements of the above-described exemplary embodiments that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain principles and the practical application, and to enable others of ordinary skill in the art to understand the various embodiments with various modifications as are suited to the particular use contemplated.

What is claimed is:

1. A method for semiconductor structure design comprising:
   performing, by a processor, error processing of an initial design file layout;
   detecting, by the processor, a tip-to-tip (T2T) structure design violation at a design cell boundary for a metal layer above (Ma) a via (Vx) at a tip of the Ma for the initial design file layout for a semiconductor structure based on a library of pattern rules;
   upon detection of the T2T structure design violation, retargeting, by the processor, the Vx for generating a resulting design file layout of the semiconductor structure; and
   generating a physical semiconductor structure based on the resulting design file layout of the semiconductor structure.

2. The method of claim 1, wherein the error processing uses the library of pattern rules that comprises design rules for pattern checking and retargeting tables.

3. The method of claim 2, wherein retargeting the Vx is based on adjusting any of the Ma, a metal layer (Mb) below the Vx that connects the Ma through the Vx and the Vx that connects the Ma and the Mb.

4. The method of claim 3, further comprising:
   determining whether the Vx is at a first metal line end (LE);
   upon the Vx being at the metal LE, setting a T2T design value for the resulting design file layout for the semiconductor structure;
   analyzing the Ma, the Vx and the Mb to determine whether the Mb is at a second metal LE; and
   upon the Vx not being at the first metal LE, relaxing T2T requirement values for the initial design file layout for the semiconductor structure.

5. The method of claim 4, further comprising:
   upon a determination that the Mb is not at the second metal LE, determining the Mb available space at a common edge (E_VxMb) between the Mb and the Vx; and
   upon a determination that the Mb available space at E_VxMb is greater than a minimum allowable space for the Mb, jogging a design value for the Mb, retargeting a design value for the Vx using the retargeting tables and executing a design process or using a first set of predetermined design values, otherwise upon a determination that the Ma available space at a common edge (E_VxMa) between the Ma and the Vx is greater than a minimum allowable space for the Ma, jogging a design value for the Ma, retargeting the design value for the Vx using the retargeting tables and executing the design process or using a second set of predetermined design values.

6. The method of claim 4, further comprising:
   upon a determination that the Mb is at the second metal LE, upon a determination that the Ma available space at E_VxMa is greater than the minimum allowable space for the Ma and the Mb available space at E_VxMb is greater than the Mb minimum space, jogging the design value for the Ma and for the Mb, retargeting the design value for the Vx using the retargeting tables and executing the design process or using a third set of predetermined design values, otherwise inserting a dummy track into the initial design file layout for the semiconductor structure, wherein the retargeting of the Vx comprises retargeting, using the retargeting tables, metal below the Vx in a vertical direction to avoid Vx metal shorting.

7. The method of claim 6, further comprising:
   upon a determination that the resulting design file layout for the semiconductor structure falls outside of a three sigma area for the Vx, re-determining whether the Mb is at the second metal LE, otherwise outputting the resulting design file layout as a final design file layout for the semiconductor structure.

8. A computer program product for generating a semiconductor structure design, the computer program product comprising a computer readable storage device having program instructions embodied therewith, the program instructions executable by a computer to cause the computer to:
  performing, by the computer, error processing of an initial design file layout;
  detect, by the computer, a tip-to-tip (T2T) structure design violation at a design cell boundary for a metal layer above (Ma) a via (Vx) at a tip of the Ma for the initial design file layout for a semiconductor structure based on a library of pattern rules;
  upon detection of the T2T structure design violation, retarget the Vx for generating a resulting design file layout of the semiconductor structure; and
  generate, by the computer, a physical semiconductor structure based on the resulting design file layout of the semiconductor structure.

9. The computer program product of claim 8, wherein the error processing uses the library of pattern rules that comprises design rules for pattern checking and retargeting tables, and retarget of the Vx is based on adjusting any of the Ma, a metal layer (Mb) below the Vx that connects the Ma through the Vx and the Vx that connects the Ma and the Mb.

10. The computer program product of claim 9, wherein the program instructions executable by the computer to further cause the computer to:
  determine, by the computer, whether the Vx is at a first metal line end (LE);
  upon the Vx being at the metal LE, set, by the computer, the T2T design value for the design file layout for the semiconductor structure;
  analyze, by the computer, the Ma, the Vx and the Mb to determine whether the Mb is at a second metal LE; and
  upon the Vx not being at the first metal LE, relax, by the computer, T2T requirement values for the initial design file layout for the semiconductor structure.

11. The computer program product of claim 10, wherein the program instructions executable by the computer to further cause the computer to:
  upon a determination that the Mb is not at the second metal LE, determine, by the computer, the Mb available space at a common edge (E_VxMb) between the Mb and the Vx; and
  upon a determination that the Mb available space at E_VxMb is greater than a minimum allowable space for the Mb, jog, by the computer, a design value for the Mb, retarget a design value using the retargeting tables for the Vx and execute, by the computer, a design process or using a first set of predetermined design values, otherwise upon a determination that the Ma available space at a common edge (E_VxMa) between the Ma and the Vx is greater than a minimum allowable space for the Ma, jog, by the computer, a design value for the Ma, retarget the design value using the retargeting tables for the Vx and execute, by the computer, the design process or using a second set of predetermined design values.

12. The computer program product of claim 10, wherein the program instructions executable by the computer to further cause the computer to:
  upon a determination that the Mb is at the second metal LE and upon a determination that the Ma available space at E_VxMa is greater than the minimum allowable space for the Ma and the Mb available space at E_VxMb is greater than the Mb minimum space, jog, by the computer, the design value for the Ma and for the Mb, retarget using the retargeting tables, by the computer, the design value for the Vx and execute, by the computer, the design process or using a third set of predetermined design values, otherwise insert, by the computer, a dummy track into the initial design file layout for the semiconductor structure.

13. The computer program product of claim 10, wherein the retarget of the Vx comprises retarget, using the retargeting tables, metal below the Vx in a vertical direction to avoid Vx metal shorting.

14. The computer program product of claim 13, wherein the program instructions executable by the computer to further cause the computer to:
  upon a determination that the resulting design file layout for the semiconductor structure falls outside of a three sigma area for the Vx, re-determine, by the computer, whether the Mb is at the second metal LE, otherwise output, by the computer, the resulting design file layout as a final design file layout for the semiconductor structure.

15. A method for generating a semiconductor structure design comprising:
  performing, by a processor, error processing of an initial design file layout using a library of pattern rules;
  detecting, by the processor, a tip-to-tip (T2T) structure design violation at a design cell boundary for a metal layer above (Ma) a via (Vx) at a tip of the Ma for the initial design file layout for the semiconductor structure based on pattern checking using the library of pattern rules;
  upon detection of the T2T structure design violation, retargeting using the retargeting tables, by the processor, design values for the Vx for generating a resulting design file layout of the semiconductor structure; and
  generating a physical semiconductor structure based on the resulting design file layout of the semiconductor structure.

16. The method of claim 15, wherein the library of pattern rules comprises design rules for pattern checking and retargeting tables.

17. The method of claim 16, wherein retargeting the design values for the Vx is based on adjusting design values for any of the Ma, a metal layer (Mb) below the Vx that connects the Ma through the Vx and the Vx that connects the Ma and the Mb, and adjusting design values of both the Ma and the Mb provide fixing metal tip or metal ending across cell boundaries.

18. The method of claim 17, further comprising:
  determining whether the design values for the Vx is at a first metal line end (LE);
  upon the design values for the Vx being at the metal LE, setting a T2T design value for the resulting design file layout for the semiconductor structure;
  analyzing the design values for the Ma, the Vx and the Mb to determine whether the design values for the Mb are at a second metal LE; and
  upon the Vx not being at the first metal LE, relaxing T2T requirement values for the initial design file layout for the semiconductor structure.

19. The method of claim 18, further comprising:
  upon a determination that the design values of the Mb are not at the second metal LE, determining the Mb available space at a common edge (E_VxMb) between the Mb and the Vx; and
  upon a determination that the Mb available space at E_VxMb is greater than a minimum allowable space for the Mb, jogging design values for the Mb, retargeting design values for the Vx using the retargeting tables and executing a design process or using a first set of predetermined design values, otherwise upon a determination that the Ma available space at a common edge (E_VxMa) between the Ma and the Vx is greater than a minimum allowable space for the Ma, jogging design values for the Ma, retargeting the design values for the Vx using the retargeting tables and executing the design process or using a second set of predetermined design values.

20. The method of claim 18, further comprising:

upon a determination that the Mb is at the second metal LE, upon a determination that the Ma available space at E_VxMa is greater than the minimum allowable space for the Ma and the Mb available space at E_VxMb is greater than the Mb minimum space, jogging the design values for the Ma and for the Mb, retargeting the design values for the Vx using the retargeting tables and executing the design process or using a third set of predetermined design values, otherwise inserting a dummy track into the initial design file layout for the semiconductor structure; and upon a determination that the resulting design file layout for the semiconductor structure falls outside of a three sigma area for the Vx, re-determining whether the Mb is at the second metal LE, otherwise outputting the resulting design file layout as a final design file layout for the semiconductor structure, wherein the retargeting of the design values for the Vx comprises retargeting, using the retargeting tables, design values for metal below the Vx in a vertical direction to avoid Vx metal shorting.

* * * * *